United States Patent [19]

Okajima

[11] Patent Number: 5,418,791
[45] Date of Patent: May 23, 1995

[54] SEMICONDUCTOR INTEGRATED CIRCUIT HAVING TEST CIRCUIT

[75] Inventor: Yoshinori Okajima, Kanagawa, Japan

[73] Assignee: Fujitsu Limited, Kawasaki, Japan

[21] Appl. No.: 810,750

[22] Filed: Dec. 19, 1991

[30] Foreign Application Priority Data

Dec. 20, 1990 [JP] Japan .................. 2-413513

[51] Int. Cl.⁶ .................. H04B 17/00; G06F 11/00
[52] U.S. Cl. .................. 371/22.1; 371/48
[58] Field of Search .................. 371/21.1, 21.4, 21.2, 371/22.1, 48; 307/270, 246, 570

[56] References Cited

U.S. PATENT DOCUMENTS

| | | | |
|---|---|---|---|
| 4,502,140 | 2/1985 | Proebsting | 371/28 |
| 4,504,929 | 3/1985 | Takemae et al. | 365/210 |
| 4,645,951 | 2/1987 | Uragami | 307/446 |
| 4,744,061 | 5/1988 | Takemae et al. | 365/201 |
| 4,862,421 | 8/1989 | Tran | 365/189 |
| 4,967,100 | 10/1990 | Okutsu et al. | 307/270 |
| 5,148,398 | 9/1992 | Kohno | 365/201 |

FOREIGN PATENT DOCUMENTS 0094238 11/1983 European Pat. Off. .

OTHER PUBLICATIONS

Patent Abstracts of Japan, vol. 008, No. 245 (P-312) Nov. 10, 1984, & JP-A-59 117 790 (Hitachi Maikuro Computer Engineering KK) Abstract.
A. H. Shah et al., "A 4-Mbit Dram with Trench-Transistor Cell," IEEE Journal of Solid-State Circuits, vol. 21, No. 5, Oct. 1986, New York, USA, pp. 618-626 XP000050948.
Patent Abstracts of Japan, vol. 014, No. 521 (P-1131) Nov. 15, 1990 & JP-A-22 18 095 (NEC Corp) Abstract.
Y. Okajima et al., "7ns 4MB BiCMOS SRAM with Parallel Testing Circuit," IEEE International Solid-State Circuits Conference, vol. 34, Feb. 1991, New York, US, pp. 54-55, XP000237798.

Primary Examiner—Robert W. Beausoliel, Jr.
Assistant Examiner—Joseph E. Palys
Attorney, Agent, or Firm—Staas & Halsey

[57] ABSTRACT

A semiconductor integrated circuit includes a plurality of data buses, and emitter-follower circuits arranged in the data buses. Read parts, which are coupled to the emitter-follower circuits, read data transferred via the data buses via the emitter-follower circuits. A test part, which is coupled to the emitter-follower circuits, determines, in a test-mode, whether or not the data transferred via the data buses have an error and outputs a test output signal to one of the data buses. The output test signal has a potential level higher than that of the data transferred via the data buses in a normal mode.

34 Claims, 12 Drawing Sheets

SEMICONDUCTOR INTEGRATED CIRCUIT HAVING TEST CIRCUIT

BACKGROUND OF THE INVENTION

1. Field of the Invention

The present invention generally relates to semiconductor integrated circuits, and more particularly to a test circuit built in a semiconductor integrated circuit having a plurality of data buses.

2. Description of the Prior Art

As the integration density of integrated circuit memories increases and hence the storage capacity thereof increases, an increased number of data buses is used and a memory cell array is divided into a plurality of blocks.

FIG. 1 is a block diagram of a conventional memory circuit which can simultaneously output four bits. Four pairs of data buses DB1-DB4 are shown in FIG. 1. Data read out from memory cells (not shown) through four pairs of data buses DB1-DB4 are output to the outside of the memory through sense amplifiers SA1-SA4 and buffers BUF1-BUF4, respectively.

A test circuit TC is provided in common to the four pairs of data buses DB1-DB4. In a test mode, the test circuit TC receives, via four pairs of MOS transistors MT1-MT4, data read out from the memory cells after writing test data therein, and outputs a pass/fail output signal to the outside of the memory through a pair of MOS transistors MT6 and the buffer BUF4. In the test mode, a test select signal TS, which is applied to the gates of the MOS transistors MT1-MT4 and MT6, is switched to a high level, so that these MOS transistors are turned ON. A pair of MOS transistors MT5 is interposed between the sense amplifier SA4 and the buffer BUF4. An inverted version of the test select signal TS is applied to the gates of the MOS transistors MT5.

FIG. 2 is a circuit diagram of a conventional 16-bit simultaneous test type memory. When all 16 data buses DB0-DB15 are maintained at a logically high level H, an output signal of a NAND gate G3 generates a high-level signal. In a test mode, a parallel-test enable signal PTE is maintained at H, and hence a NAND gate G4 and a NOR gate G5 are open. Thus, an output signal of the NAND gate G4 has a logically low level L, and the NOR gate G5 generates a low-level signal. As a result, a parallel-test output signal PTO output by a CMOS inverter consisting of transistors Ta and Tb is maintained at H. If at least one of the data buses DB0-DB15 is maintained at L (abnormal state) in the case where all the 16 bits of data are maintained at H in a normal state, the output signal of the NAND gate G1 switches to H, and an output signal of an OR gate G2 switches to H. Hence the output signal of the NAND gate G3 switches to L, and the output signal of the NAND gate G4 switches to H. Further, the output signal of the NOR gate G5 switches to H, and hence the output signal PTO of the CMOS inverter switches to L.

When all the 16 data buses DB0-DB15 are maintained at L, the output signals of the gates G1 and G3 are maintained at H and the output signal of the gate G2 is maintained at L. Hence, the output signal PTO of the CMOS inverter is maintained at H. If at least one of the data buses DB0-DB15 is maintained at H in the state where all the 16 bits of data are maintained at L in the normal state, the output signals of the gates G1 and G2 switch to L, and the output signal of the gate G3 switches to L. Hence, the output signal PTO of the CMOS inverter switches to L. In the manner as described above, 16 bits of data transferred through the data buses DB0-DB15 can be simultaneously tested. In the test mode in which the signal PTE is maintained at H, address buffers which pass address signals AB are disabled due to an inverted version of the signal PTE.

However, the conventional circuit shown in FIG. 1 has the following disadvantages. First, data read out from the memory cells are transmitted to the test circuit through the MOS transistors MT1-MT4. Normally, MOS transistors do not have large load driving abilities. Hence, it takes a long time to charge parasitic capacitors coupled to the data buses DB1-DB4. Normally, the data buses DB1-DB4 extending to the sense amplifiers SA1-SA4 from the memory cells are long. As a result, it is very difficult to test the memory cells at a high speed. Second, there is a delay in transferring the pass-/fail signal output by the test circuit TC to the buffer BUF4 through the MOS transistors MT6. Thus, data transmitted by the buffer BUF4 lags behind other data transmitted by the buffers BUF1-BUF3 since the MOS transistors MT5 are interposed only between the sense amplifier SA4 and the buffer BUF4. Third, it is impossible to supervise the sense amplifier SA4 since the signals transmitted by the test circuit TC do not pass the sense amplifier SA4.

The conventional circuit shown in FIG. 2 has the following disadvantages. First, the gates G1 and G2, each having 16 inputs, must be used. Such multiple-input gates have complex structures and large delay times. Thus, it takes a much longer time to obtain the signal PTO than it does to obtain it with the normal data read operation. Thus, no correlation between the test mode and the normal mode can be obtained. Further, the pass/fail signal is transmitted by a special terminal different from a read data output terminal (not shown). Hence, a large number of terminals must be used.

SUMMARY OF THE INVENTION

It is an object of the present invention to provide a semiconductor integrated circuit having a test circuit which can test memory cells at a higher speed without a large number of terminals.

This object of the present invention is achieved by a semiconductor integrated circuit comprising: a plurality of data buses; emitter-follower circuits arranged in the data buses; read means, coupled to the emitter-follower circuits, for reading data transferred on the data buses via the emitter-follower circuits; and test means, coupled to the emitter-follower circuits, for determining, in a test mode, whether or not the data transferred on the data buses have an error and for outputting a test output signal to one of the data buses, the output test signal having a potential level higher than that of the data transferred on the data buses.

It is possible to replace the emitter-follower circuits with source follower circuits.

BRIEF DESCRIPTION OF THE DRAWINGS

Other objects, features and advantages of the present invention will become apparent from the following detailed description when read in conjunction with the accompanying drawings, in which.

DESCRIPTION OF THE PREFERRED EMBODIMENTS

Figure 3:
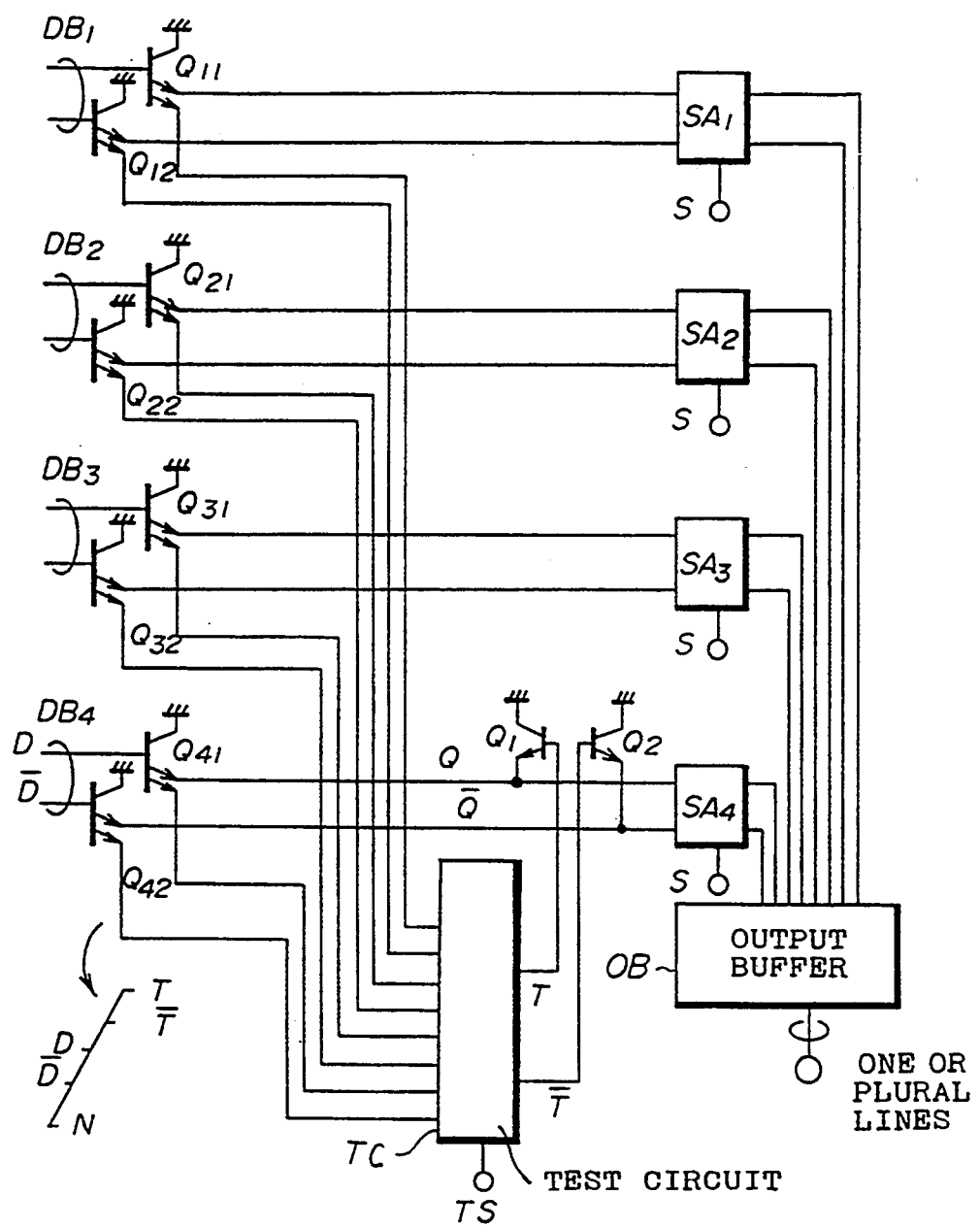
FIG. 3 is a block diagram of a first embodiment of the present invention.

Referring to FIG. 3, multi-emitter bipolar transistors Qi1 and Qi2 (i=1, 2, 3, 4) are inserted into the connection between a data bus DBi including a pair of data bus lines and a sense amplifier SAi and the connection between the data bus DBi and a test circuit TC. The sense amplifiers SA1–SA4 are activated by select signals S. An output buffer OB receives pairs of read signals from the sense amplifiers SA1–SA4, and amplifies these signals. Amplified signals are then transmitted to one or a plurality of terminals through an output buffer OB.

Each of the transistors Q11–Q41 and Q12–Q42 has two emitters. One of the two emitters of the transistor Q11 is connected to the sense amplifier SA1, and the other emitter thereof is connected to the test circuit TC. Similarly, one of the two emitters of the transistor Q12 is connected to the sense amplifier SA1, and the other emitter thereof is connected to the test circuit TC. In the same manner as described above, the two emitters of each of the transistors Q21, Q22, Q31, Q32, Q41 and Q42 are connected to the respective sense amplifier and the test circuit TC.

In a test mode, the test circuit TC is activated by the test select signal TS. In the test mode, test data are written into memory cells (not shown) and data read out therefrom are transmitted to the data buses DB1–DB4. Then, the data are applied to the sense amplifiers SA1–SA4 and the test circuit TC via the transistors Q11, Q12, Q21, Q22, Q31, Q32, Q41 and Q42. The test circuit TC determines whether or not all the data received through the transistors Q11–Q41 are the same as each other, and determines whether or not all the data received through the transistors Q12–Q42 are the same as each other. The result of this determination (which shows pass or fail) is represented by two test output signals T and $\overline{T}$. Bipolar transistors Q1 and Q2 are driven by the test output signals T and $\overline{T}$ received from the test circuit. More specifically, the bases of the transistors Q1 and Q2 receive the test output signals T and $\overline{XT}$, respectively, and the emitters thereof are connected to one of the data bus lines DB4 which transfers a Q output signal and the other data bus line DB4 which transmits a $\overline{XQ}$ output signal. The collectors of the transistors Q1 and Q2 are grounded (or supplied with a power supply voltage).

FIG. 3 also shows a relationship between the potentials of the data buses DB1–DB4 (data signals D and $\overline{XD}$) and the potentials of the test output signals T and $\overline{XT}$. As shown in FIG. 3, the potentials of the test output signals T and $\overline{XT}$ are higher than those of the data signals D and $\overline{XD}$ which are transmitted through the data bus lines. Although which one of the test output signals T and $\overline{XT}$ switches to a high level depends on read data, the test output signals T and $\overline{XT}$ have different potentials. It is assumed that in the embodiment shown in FIG. 3, the test output signal T is higher than the test output signal $\overline{XT}$. Similarly, the data signals D and $\overline{XD}$ have different potentials, and it is assumed that in the embodiment shown in FIG. 3, the data signal D is higher than the data signal $\overline{XD}$.

In the test mode, the data bus DB4 connected to the sense amplifier SA4 is driven by not only the transistors Q1 and Q2 but also the transistors Q41 and Q42. However, as has been described above, the potentials of the data signals D and $\overline{XD}$ are lower than the test output signals T and $\overline{XT}$. Hence, the potentials of the input terminals of the sense amplifier SA4 are determined by the test output signals T and $\overline{XT}$. In other words, the test output signals T and $\overline{XT}$ are not effected by the data signals D and $\overline{XD}$ in the test mode. In the normal read mode, the test output nodes T and $\overline{XT}$ are set to a lowest potential N, and the potentials of the input terminals of the sense amplifier SA4 are determined by the data signals D and $\overline{XD}$. That is, the input terminals of the sense amplifier SA4 are not effected by the test output signals T and $\overline{XT}$ in the normal read mode.

Figure 1:
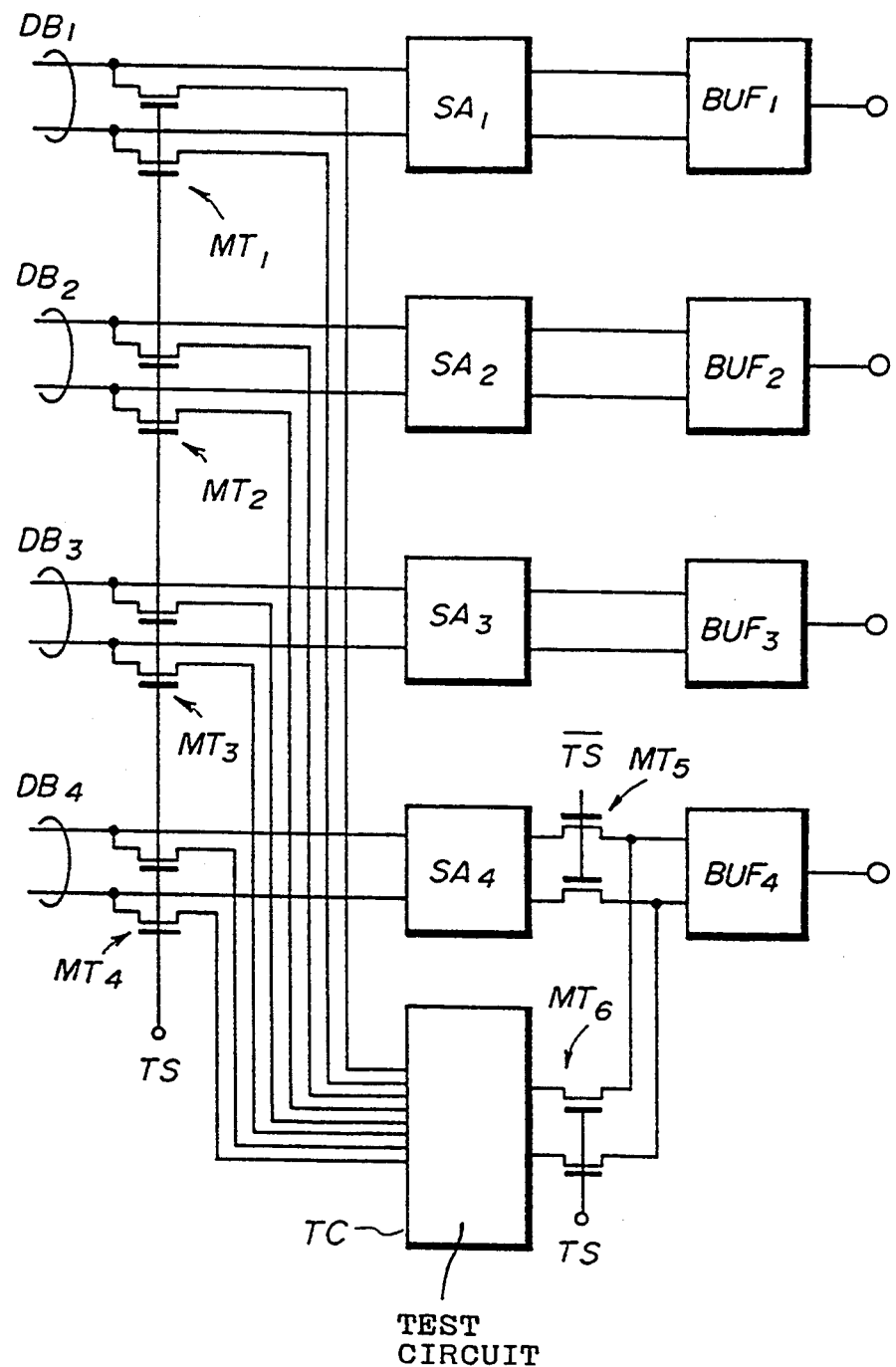
FIG. 1 is a block diagram of a conventional memory having a built-in test circuit.
Figure 2:
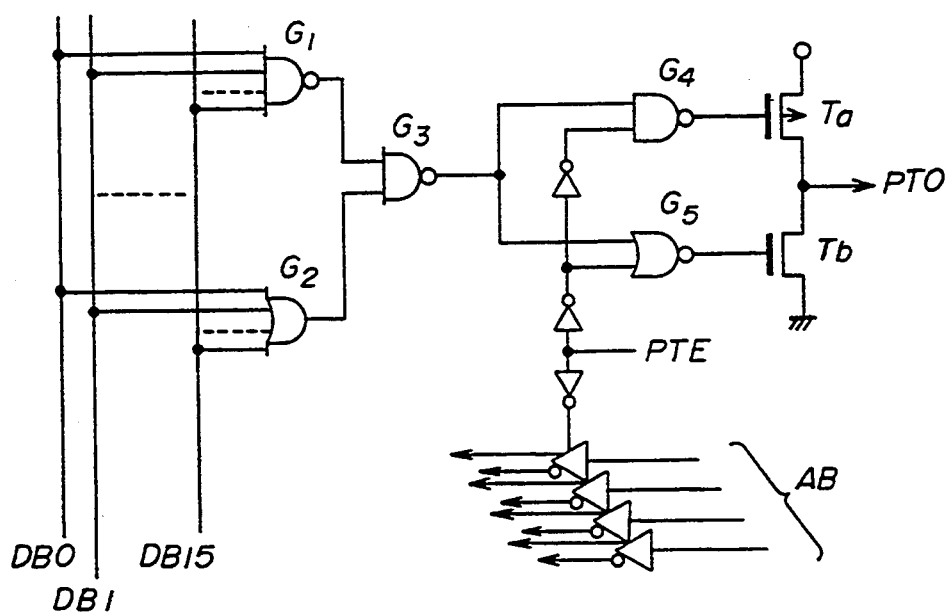
FIG. 2 is a circuit diagram of another conventional memory having a built-in test circuit.

The configuration shown in FIG. 3 has the following advantages. First, the emitter-follower circuits of the transistors Q1, Q2, Q11, Q12, Q21, Q22, Q31, Q32, Q41 and Q42 have larger driving abilities than the MOS transistor switches shown in FIG. 1. Thus, the data buses DB1–DB4 shown in FIG. 3 can be driven at a higher speed than the data buses DB1–DB4 shown in FIG. 1. Even if the data buses DB1–DB4 are long and large parasitic capacitors are coupled thereto, the emitter-follower transistors can rapidly drive the data buses DB1–DB4. Hence, the time it takes to test the memory cells can be shortened.

Second, one of the two emitters of the transistor Q41 and the emitter of the transistor Q1 are coupled to each other through one of the two lines of the data bus DB4, and one of the two emitters of the transistor Q42 and the emitter of the transistor Q2 are coupled to each other through the other line of the data bus DB4. With this arrangement, it becomes possible to transfer read data to the sense amplifier SA4 without being affected by the transistors Q1 and Q2. Particularly, there is no delay in transmitting the data to the sense amplifier SA4, since there are no switching elements in the data bus DB4. In addition, the sense amplifiers SA1–SA4 simultaneously output the respective signals to the output buffer OB.

In the test mode, predetermined test data consisting of, for example, only binary ones (or binary zeros) are written into memory cells, and then read out therefrom. Read data output to the data buses DB1–DB4 are input to the test circuit TC through the emitter follower transistors Q11–Q41 and Q12–Q42. The test circuit TC determines whether or not all the bits of the read data transferred through the transistors Q11–Q41 are the same as each other and determines whether or not all the bits of the read data transmitted through the transistors Q12–Q42 are the same as each other. The test circuit TC is composed of, for example, two exclusive-OR gates if the test data consists of only binary ones (or binary zeros). If the test data are correctly read out from the memory cells, the test output signal T is maintained at, for example, H and the test output signal $\overline{XT}$ is maintained at L.

As has been described previously, the potentials of the test output signals T and $\overline{XT}$ are higher than those of the data signals D and $\overline{XD}$. Thus, the input terminals Q and $\overline{XQ}$ of the sense amplifier SA4 are based on only the test output signals T and $\overline{XT}$. For example, T = −0.5 V, $\overline{XT}$ = −0.8 V, D = −1.0 V, $\overline{XD}$ = −1.2 V and N = −1.3 V. When all the bits of the read data transmitted through the transistors Q11–Q41 are the same as each other and all the bits of the read data transmitted through via the transistors Q12–Q42 are the same as each other, $Q = T - V_{BE}$ and $\overline{XQ} = /T - V_{BE}$ where $V_{BE}$ denotes an emitter-base voltage of each of the transistors Q1 and Q2. On the other hand, if abnormal data unexpected is read out, $Q = \overline{XT} - V_{BE}$ and $\overline{XQ} = T - V_{BE}$. The output signals of the sense amplifier SA4 obtained in the test mode are then output to the outside of the memory through the output buffer OB.

Figure 4:
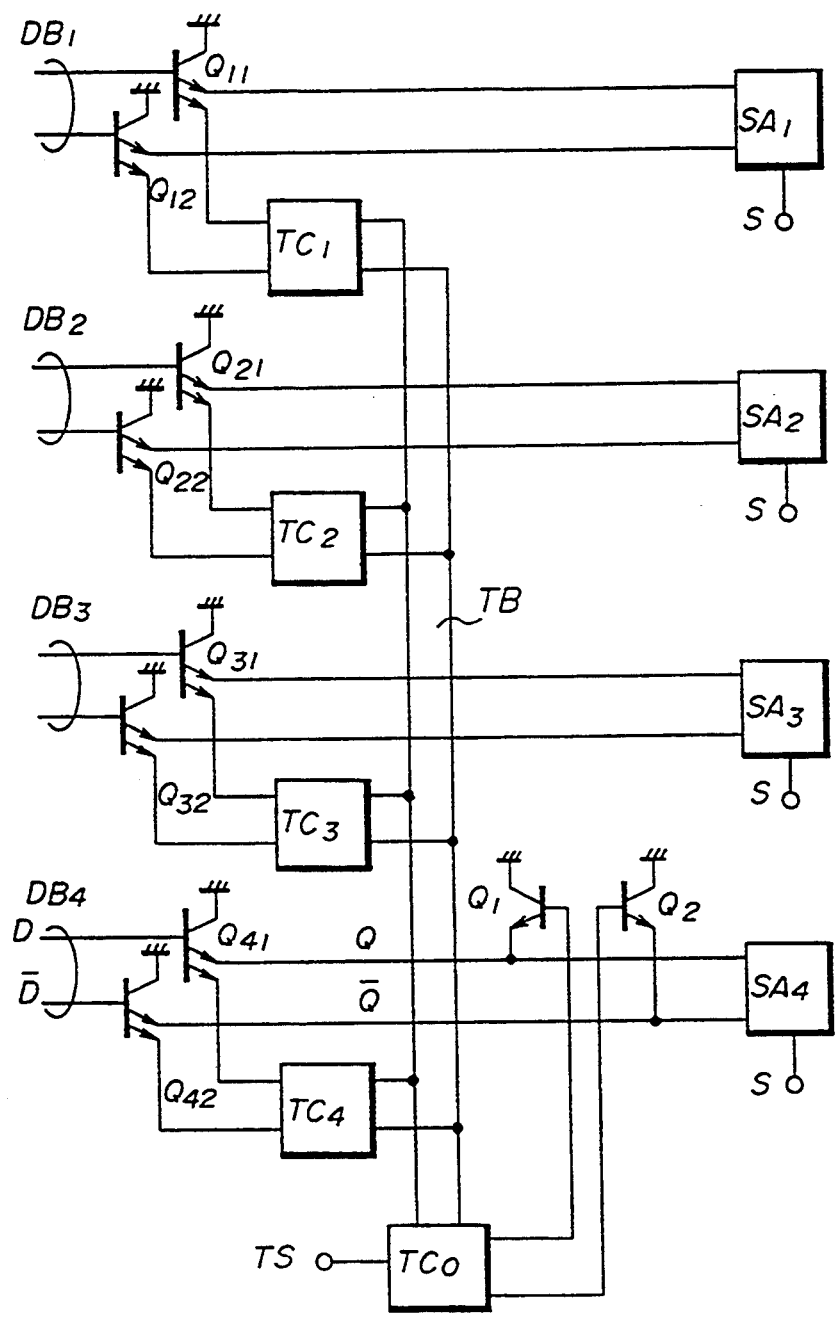
FIG. 4 is a block diagram of a second embodiment of the present invention.

FIG. 4 shows a second embodiment of the present invention. In FIG. 4, parts which are the same as those shown in FIG. 3 are given the same reference numerals. A test circuit used in the second embodiment of the present invention is composed of four first stage test circuits TC1–TC4, and a single second stage test circuit TC0. In other words, the test circuit TC shown in FIG. 3 is replaced by the test circuits TC0–TC4. The test circuits TC1–TC4 are connected to the test circuit TC0 through a test bus TB composed of a pair of test bus lines.

The test circuit TC1 determines whether or not two bits of the read data transferred through two lines of the data bus DB1 are different from each other, and transmits a two-bit signal indicating the result of this determination to the test circuit TC0 through the test bus TB. Each of the other test circuits TC2–TC4 operates in the same manner. It will be noted that two output terminals of the test circuits TC0–TC4 are connected in common to the test bus TB (wired OR). The test circuit TC0 receives the test output signals of the test circuits TC1–TC4 through the test bus TB, and determines whether or not the potential of one of the two lines of the test bus TB is different from that of the other line of the test bus TB. It will be noted that each of the test circuits TC0–TC4 is formed with, for example, a two-input exclusive-OR gate, while the test circuit TC shown in FIG. 3 is composed of two four-input exclusive-OR gates. It is easy to fabricate two-input exclusive-OR gates, as compared with four-input exclusive-OR gates.

Figure 5:
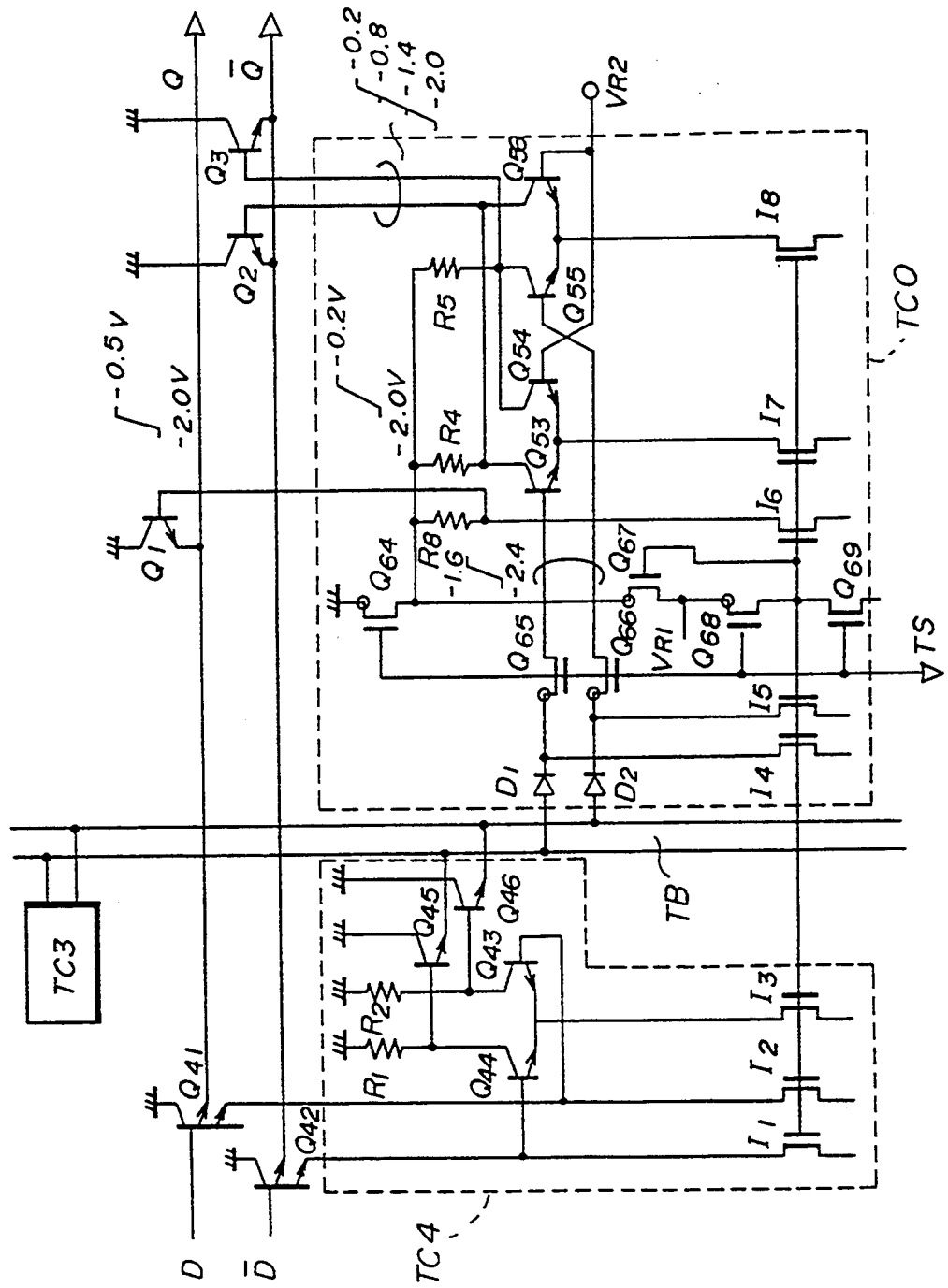
FIG. 5 is a circuit diagram of the second embodiment of the present invention shown in FIG. 4.

FIG. 5 is a circuit diagram of the second embodiment of the present invention shown in FIG. 4. In FIG. 5, parts which are the same as those shown in FIG. 4 are given the same reference numerals. FIG. 5 shows only the test circuit TC4 of the first stage, and the test circuit TC0 of the second stage. It will be noted that a transistor Q3 is provided in addition to the transistor Q2. One of the two test output signals output by the test circuit TC0 is transmitted to one (Q) of the lines of the data bus DB4 through the transistor Q1, and the other test output signal is transmitted to the other data bus line ($\overline{XQ}$) via the transistors Q2 and Q3.

The test circuit TC4 is composed of transistors Q43–Q46, resistors R1 and R2, and constant-current sources I1–I3. The transistors Q43 and Q44 form a differential amplifier. The transistor Q45 forms an emitter-follower circuit, and the transistor Q46 forms an emitter-follower circuit. More specifically, the bases of the transistors Q43 and Q44, which are connected to the constant-current sources I2 and I1, respectively, are connected to the data bus lines D and $\overline{XD}$, and the emitters thereof are connected to the constant-current source I3. The collectors of the transistors Q43 and Q44 are grounded through the resistors R2 and R1, respectively. The emitters of the transistors Q45 and Q46 are connected to the test bus lines TB, and the collectors thereof are grounded.

The test circuit TC0 is composed of diodes D1 and D2, transistors Q53–Q56 and Q64–Q69, resistors R3–R5, and constant-current sources I4–I8. In the test mode, test data D and $\overline{XD}$ are read out from the memory cell and applied to the bases of the transistors Q41 and Q42. For example, the base of the transistor Q41 is set to −1.0 V, and the base of the transistor Q42 is set to −1.3 V. In this case, the emitter of the transistor Q41 is set to L, and the emitter of the transistor Q42 is set to H. The transistor Q44 is turned ON and the transistor Q43 is turned OFF. Thus, the transistor Q45 is turned ON, and the transistor Q46 is turned ON.

If the test data consists of only binary ones or zeros and there is no error, one of the two test output signals of each of the test circuits TC1–TC4 is set to H, and the other test output signal is set to L. Hence, the test bus TB connected to the transistor Q45 is maintained at, for example, H, and the test bus TB connected to the transistor Q46 is maintained at L. In this case, if the test data read out from the memory cell through the DB4 has an error, the potentials of the data bus lines DB4 are interchanged with each other. More specifically, the data signal D switches to H from L, and the data signal $\overline{XD}$ switches to L from H. As a result, both the test bus lines TB are maintained at H. The test circuit TC0 generates a path signal when one of the test bus lines TB is maintained at H and the other test bus line TB is maintained at L. On the other hand, the test circuit TC0 generates a fail signal when both the test bus lines TB are maintained at H.

More specifically, the test select signal TS is maintained at L in the test mode. Thus, the transistors Q64–Q68 are ON and the transistor Q69 is OFF. Hence, the signals on the test bus lines TB are respectively applied to the bases of the transistors Q53 and Q55 through the diodes D1 and D2 and the transistors Q65 and Q66, respectively. A reference voltage $V_{R2}$ is applied to the base of the transistors Q54 and Q56. A reference voltage $V_{R1}$ is applied to the drain of the transistor Q67 and the source of the transistor Q68. For example, $V_{R2} = V_{R1} = -2$ V, R3 = R4 = R5 = 1.5 ohms, I7 = I8 = 0.4 mA, and I6 = 0.2 mA. The amplitude of the signal on the test bus TB obtained on the output side of the transistor Q65 is such that H = −1.6 V and L = −2.4 V. Similarly, the amplitude of the signal on the test bus TB obtained on the output side of the transistor Q66 is such that H = −1.6 V and L = −2.4 V. It will be noted that $V_{R2}$ (= −2 V) is between H (= −1.6 V) and L (= −2.4 V). If one of the test bus lines TB is at H and the other test bus line is at L, the transistors Q53 and Q56 are ON, and the transistors Q54 and Q55 are OFF. Hence, the base of the transistor Q3 is set to H (=0.2 V) and the base of the transistor Q2 is set to L (= −1.4 V). Hence, the bus line $\overline{XQ}$ is set to H (= −0.2 V) since the emitters of the transistors Q2 and Q3 are connected in common to the bus line $\overline{XQ}$. The transistor Q1 functions to set the potential of the bus line Q to a reference voltage. In the test mode, the transistor Q1 controls the potential of the bus line Q to be equal to approximately −0.5 V based on the transistor Q64, resistor R3 and current I6. As a result, the potential of the bus line $X\overline{Q}$ is higher than that of the bus line Q if test data are correctly read out from the memory cells and transmitted through via the data buses DB1–DB4 to the sense amplifiers SA1–SA4.

On the other hand, the potentials of both the test bus lines TB are H if there is an error in test data read out from the memory cells and transmitted through the data buses DB1–DB4. In this case, the transistors Q53 and Q55 are ON, and the transistors Q54 and Q56 are OFF. Hence, the bases of the transistors Q2 and Q3 are set to an intermediate potential of −0.8 V. As a result, the potential of the bus line $X\overline{Q}$ is lower than the reference potential of the bus line Q. In the manner as described above, it is possible to determine whether or not an error has occurred by determining whether the potential of the bus line $X\overline{Q}$ is higher or lower than the reference potential of the bus line Q.

In the normal data read mode, the test select signal TS is maintained at H. Hence, the transistors Q64–Q66 and Q68 are OFF, the transistors Q67 and Q69 are ON, and the constant-current sources I1–I8 are OFF. As a result, the test circuits TC0–TC4 do not operate. The reference voltage $V_{R1}$ (= −2.0 V) is applied to the bases of the transistors Q2 and Q3 via the transistor Q67 and the resistor R4 or R5. The constant-current sources I4 and I5 are provided for the test bus lines TB, and the diodes D1 and D2 are level shift diodes.

Figure 6:
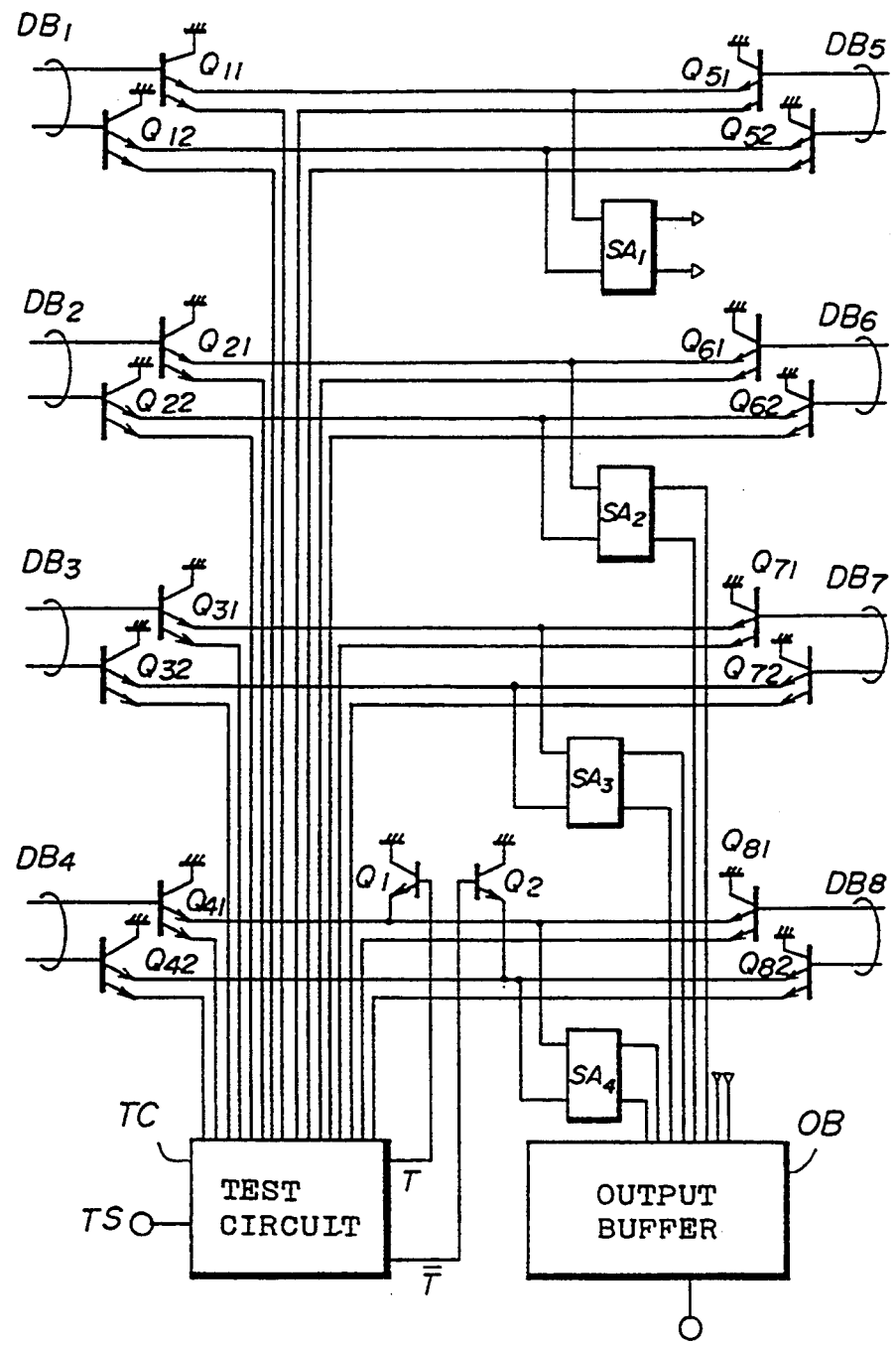
FIG. 6 is a block diagram of a third embodiment of the present invention.

FIG. 6 is a block diagram of a third embodiment of the present invention. In FIG. 6, parts which are those as shown in FIG. 3 are given the same reference numerals. In the third embodiment of the present invention, eight bits can be simultaneously tested while four bits can be simultaneously tested in the first or second embodiment. A pair of data bus lines DB5 and a pair of data bus lines DB1 are coupled to each other through transistors Q11, Q12, Q51 and Q52. That is, the emitters of the transistors Q11 and Q51 are connected to each other, and the emitters of the transistors Q12 and Q52 are connected to each other. Similarly, data buses DB6, DB7 and DB8 are coupled to the data buses DB2, DB3 and DB4 via pairs of transistors Q61 and Q62, Q71 and Q72, and Q81 and Q82. The sense amplifier SA1 is provided in common to the data buses DB1 and DB5. Each of the sense amplifiers SA2, SA3 and SA4 is provided in the same manner as described above.

A test circuit (also labeled TC) shown in FIG. 6 is connected to one of the two emitters of each of the transistors Q11–Q81 and Q12–Q82. The sense amplifiers SA1–SA4 can be positioned at a center portion of a chip, and memory cell arrays and data buses are positioned on both sides of each of the sense amplifiers SA1–SA4. With this arrangement, it becomes possible to shorten such wiring lines as data buses. It is also possible to divide the test circuit TC into first and second stages in the same manner as shown in FIG. 4.

A description will now be given of a fourth embodiment of the present invention with reference to FIGS. 7A and 7B, in which those parts which are the same as those shown in the previous figures are given the same reference numerals. As has been described previously, the test circuit TC used in each of the first, second and third embodiments of the present invention determines whether or not the data buses DB1–DB4 transfer the correct read data. A test circuit used in the fourth embodiment of the present invention can detect a response time of read data having the largest delay of time in addition to the above-mentioned determination function.

It will be noted that in actuality the data buses DB1–DB4 do not simultaneously switch to H from L or vise versa, but instead switch at slightly different times. As shown in FIG. 7B, the switching start times related to the data buses DB1–DB4 are slightly different from each other, and the switching end times are also slightly different from each other. It becomes possible to detect the response time of the read data having the largest delay time by designing the test circuit TC so that it generates an output signal if the read data having the largest delay time has become greater than a threshold value "a" shown in FIG. 7B.

Figure 7A:
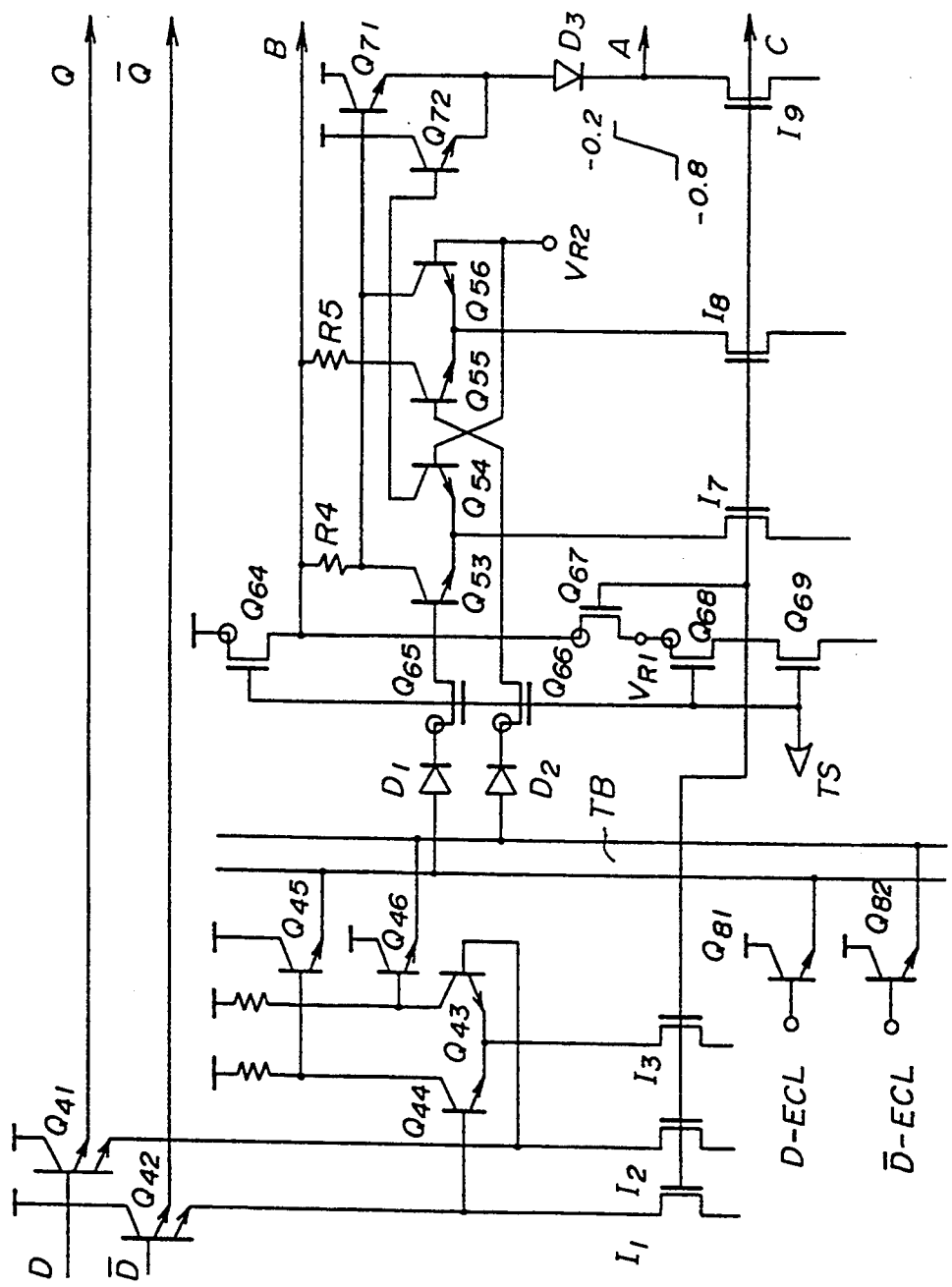
FIGS. 7A and 7B are circuit diagrams of a fourth embodiment of the present invention.
Figure 7B:
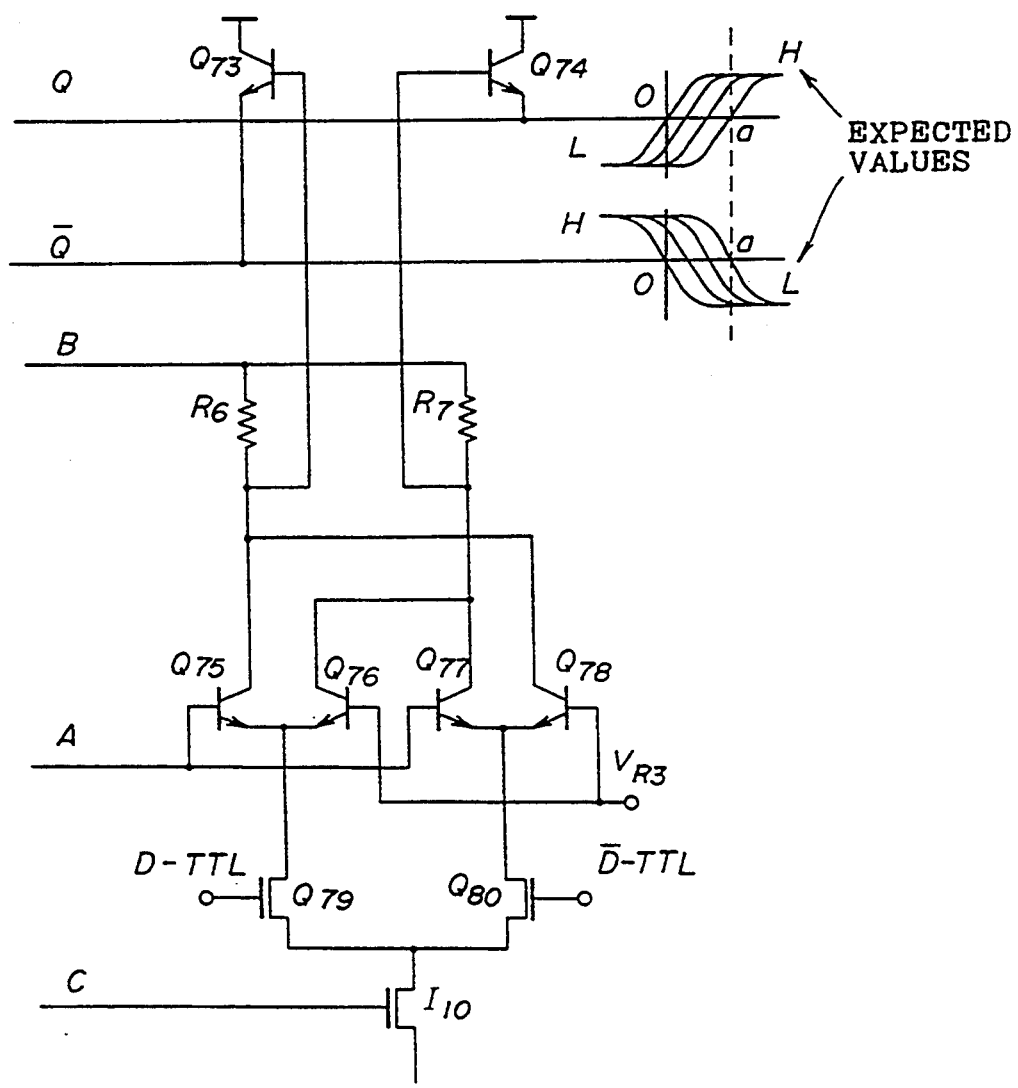

In order to realize the above-mentioned function, the test circuit TC0 shown in FIGS. 7A and 7B is composed of transistors Q53–Q56 and Q64–Q82, a diode D3, resistors R4–R7, and constant-current sources I7–I10. Expected data signals D-ECL and $\overline{XD}$-ECL, which are ECL-level signals, are applied to the bases of the transistors Q81 and Q82, respectively. The expected data signal D-ECL expects a change of the level of one of the test bus lines TB from L to H (or vice versa), and the expected data signal $\overline{XD}$-ECL expects a change of the level of the other test bus line TB from H to L (or vice versa). Expected data signals D-TTL and $\overline{XD}$-TTL, which are TTL-level signals, are applied to the bases of the transistors Q79 and Q80, respectively. The expected data signal D-TTL expects a change of the level of one of the test bus lines TB from L to H (or vice versa), and the expected data signal $\overline{XD}$-TTL expects a change of the level of the other test bus line TB from H to L (or vice versa).

As shown in FIG. 7B, the bus line Q is expected to change from L to H, and the bus line $X\overline{Q}$ is expected to change from H to L. While the potential of the bus line Q is lower than the threshold value and the potential of the bus line $X\overline{Q}$ is higher than the threshold value, the transistors Q53 and Q55 are ON and the transistors Q54 and Q56 are OFF. Thus, the transistors Q71 and Q72 are OFF, and the potential of node A shown in FIG. 7A is L (equal to −0.8 V). The node A is connected to the bases of th transistors Q75 and Q77. A reference signal $V_{R3}$ equal to, for example, −0.4 V, is applied to the bases of the transistors Q76 and Q78.

When the node A is maintained at L, the transistors Q76 and Q78 are ON, and the transistors Q75 and Q77 are OFF. When the bus line Q is expected to change from L to H, the expected data signal D-TTL is maintained at H. Thus, the transistor Q79 is ON. In the test mode, the transistor I10 is ON. Thus, current passes through the transistor Q64, the resistor R7, the transistors Q76 and Q79 and the constant-current source I10. Hence, the data bus line Q is maintained at L, while the data bus line $X\overline{Q}$ is maintained at H. These potential levels of the data bus lines Q and $X\overline{Q}$ are different from the respective expected values.

If the read data having the largest delay time transmitted through the data bus line Q has become greater than the threshold value "a", the potential of the node A switches to H from L. The high level H of the node A is higher than the reference voltage $V_{R3}$. Thus, the transistors Q75 and Q77 are turned ON, and the transistors Q76 and Q78 are turned OFF. Hence, current from the transistor Q64 passes through the resistor R6, the transistors Q75 and Q79 and the constant-current source 110. As a result, the potentials of the bases of the transistors Q73 and Q74 switch to L and H.

Figure 8:
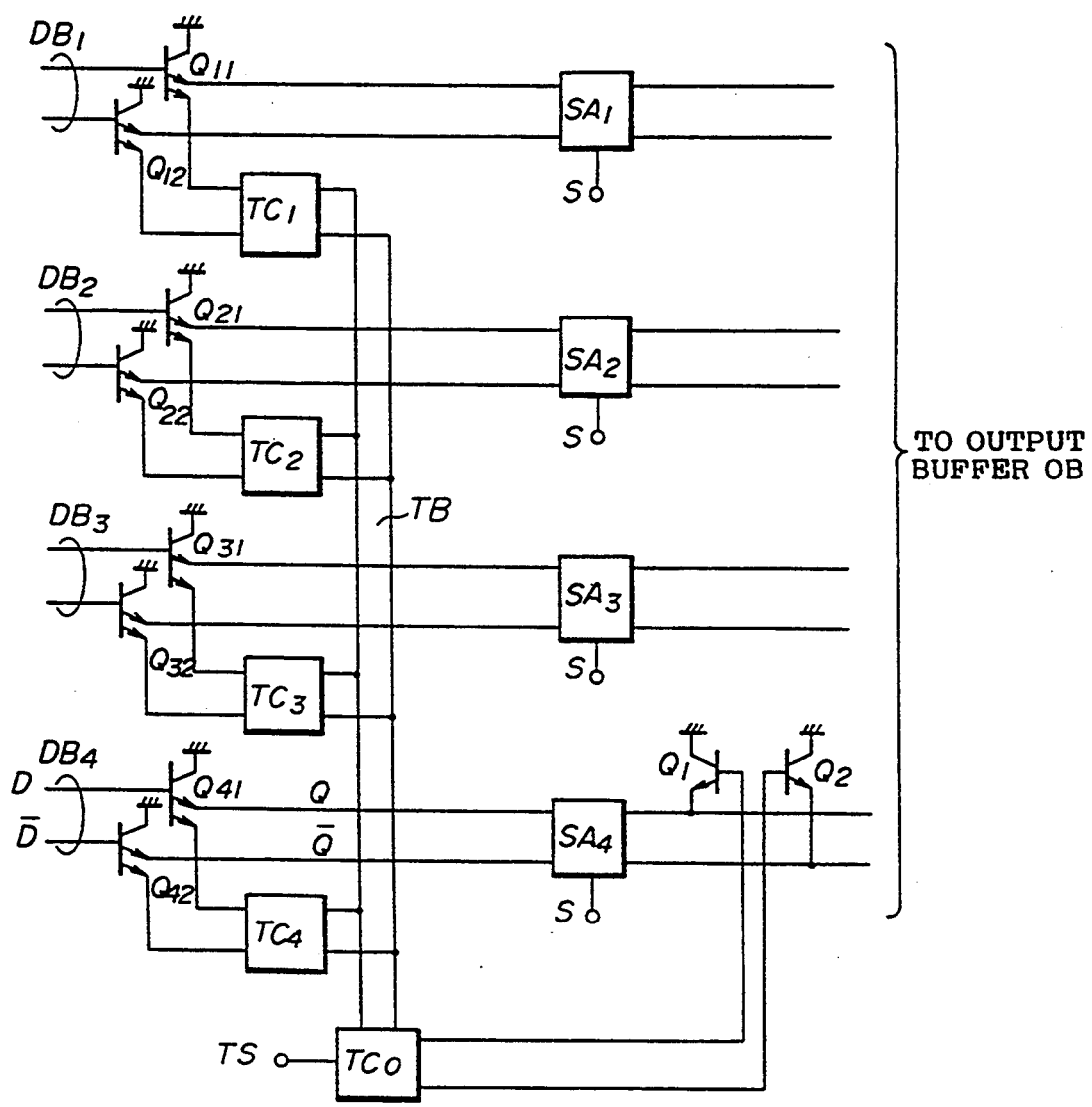
FIG. 8 is a block diagram of a variation of the configuration shown in FIG. 4.

FIG. 8 shows a variation of the second embodiment of the present invention shown in FIG. 4. In FIG. 8, parts which are the same as those shown in FIG. 4 are given the same reference numerals. The emitters of the transistors Q1 and Q2 are coupled to the output terminals of the sense amplifier SA4. Although the test output signals output by the test circuit TC0 do no pass through the sense amplifier SA4, the test operation can be executed at a high speed, as compared with the conventional circuit shown in FIG. 1.

Figure 9B:
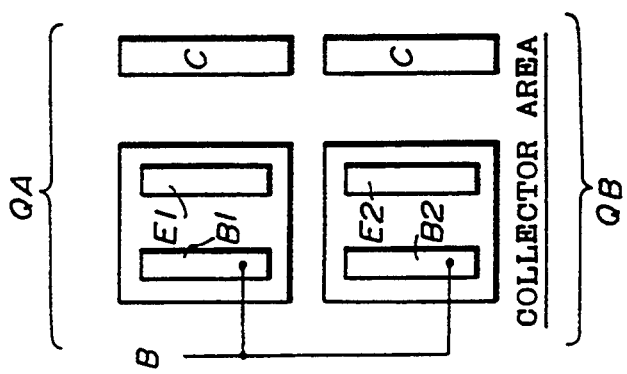
FIGS. 9A and 9B are plan views of a multi-emitter transistor used in each of the first through fourth embodiments of the present invention.
Figure 9A:
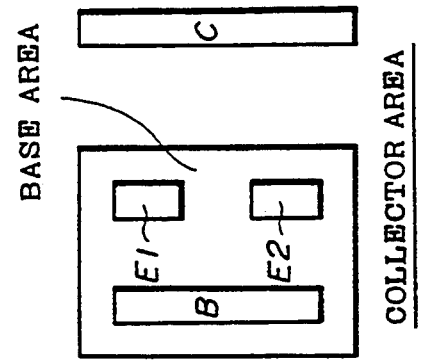

FIG. 9A shows a layout of each multi-emitter transistor described previously. A base area is formed in a collector area. A base contact B is formed in the base area, and a collector contact C is formed in the collector area. A plurality of (two) emitter areas are formed in the base area, and a plurality of (two) emitter contacts E1 and E2 are formed in the emitter areas.

FIG. 9B shows another layout of each multi-emitter transistor. As shown in FIG. 9B, two separate transistors QA and QB are formed. More specifically, two collector contacts C are formed in a collector area, and two base areas are formed in the collector area. In addition, an emitter contact E1 and a base contact B1 are formed in one of the base areas, and an emitter contact E2 and a base contact B2 are formed in the other base area.

Figure 10:
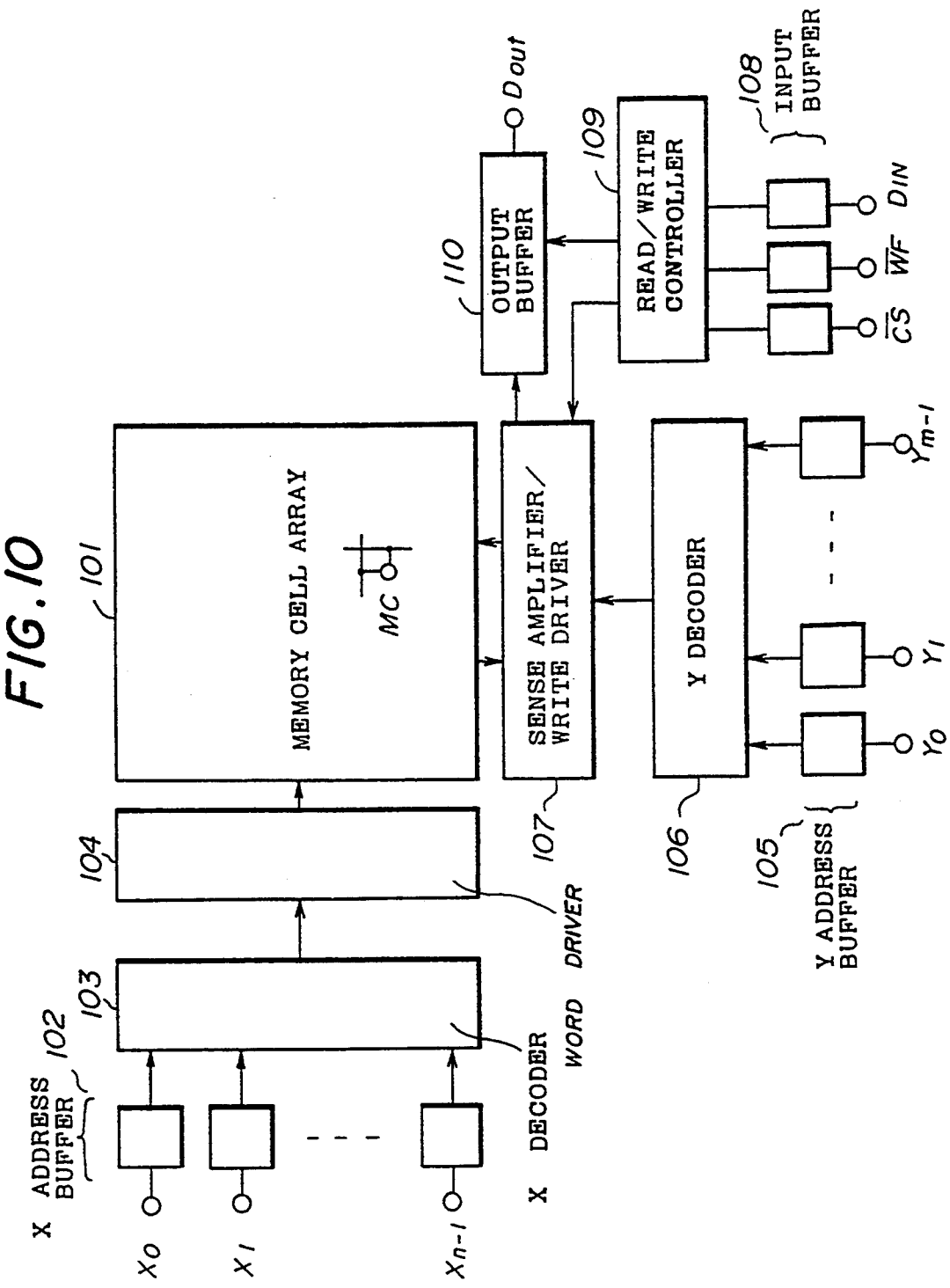
FIG. 10 is a block diagram of an SRAM to which the present invention is applied.

FIG. 10 is a block diagram of an SRAM to which the present invention is applied. The SRAM shown in FIG. 10 is composed of a memory cell array 101 including a plurality of memory cells MC arranged in rows and columns, a group of X address buffers 102, an X decoder 103, a word driver 104, a group of Y address buffers 105, a Y decoder 106, a sense amplifier/write driver 107, a group of input buffers 108, a read/write controller 109, and an output buffer 110. The present invention is applied to, for example, the sense amplifier/write driver 107.

The X decoder 102 receives X address bits X0–Xn-1 via the buffers 102, and the word driver 104 drives word lines coupled to the memory cells in the memory cell array 101 on the basis of decoded X address bits output by the X decoder 103. The Y decoder 106 receives Y address bits Y0–Yn-1 via the buffers 105, and the write driver 107 controls sense amplifiers, such as SA1–SA4 on the basis of decoded Y address bits. A chip select signal $\overline{CS}$, a write enable signal $\overline{WE}$ and write data Din are applied to the read/write controller 109 via the buffers 108. The read/write controller 109 controls the sense amplifier/write driver 107 so that write data Din are written into memory cells specified by the Y decoder 106. Read data from the memory cell array 101 are applied to the output buffer 110.

Figure 11:
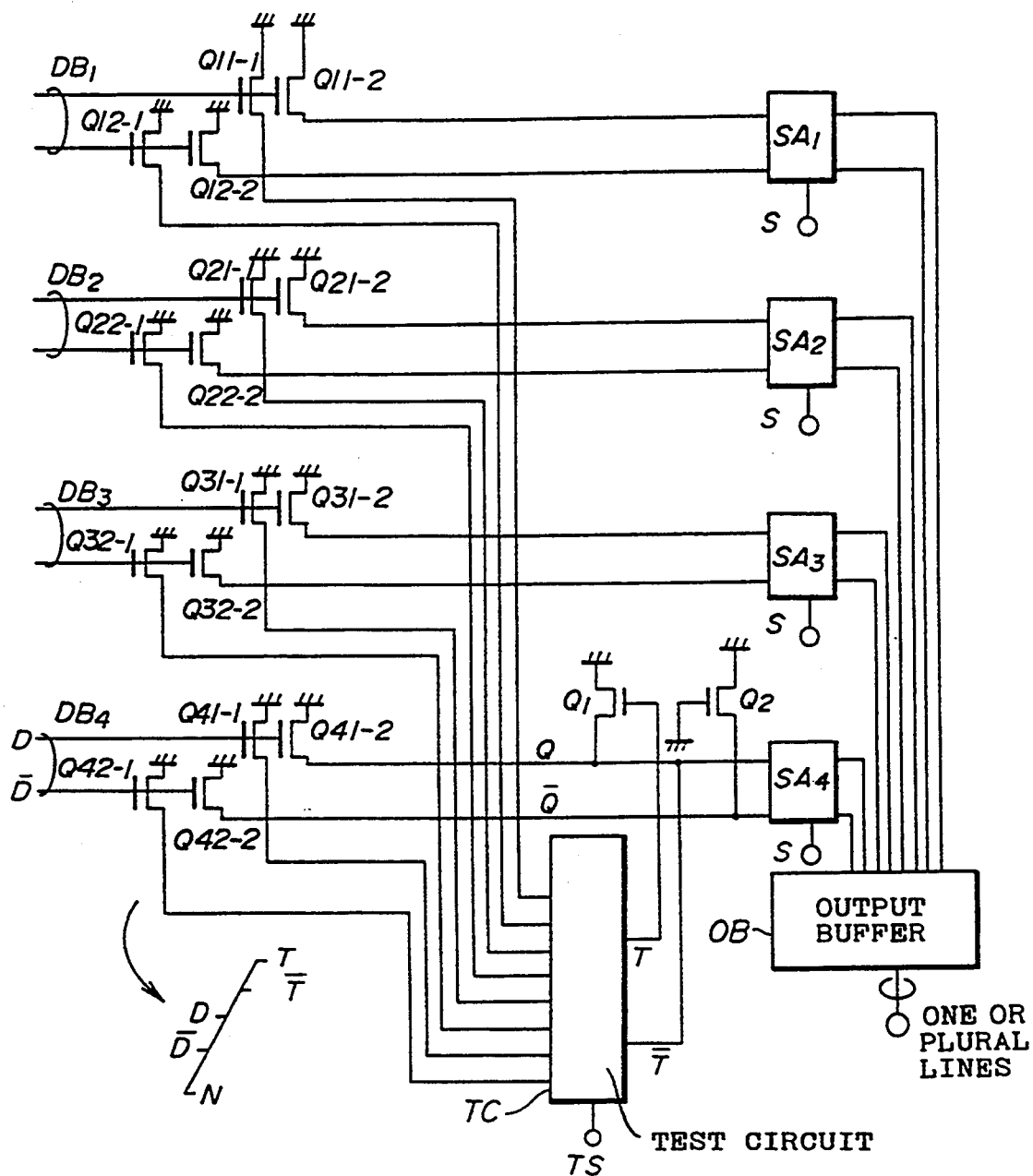
FIG. 11 is a fifth embodiment of the present invention.

FIG. 11 is a fifth embodiment of the present invention. In FIG. 11, parts which are the same as those shown in FIG. 3 are given the same reference numerals. The multi-emitter transistor Qi1 is replaced by FETs, such as IGFETs (Integrated Gate Field Effect Transistors) Qi1-1 and Qi1-2, and the multi-emitter transistor Qi2 is replaced by FETs Qi2-1 and Qi2-2, such as IGFETs. The transistors Q1 and Q2 are replaced by FETs, such as IGFETs. It can be seen from the above that the fifth embodiment of the present invention employs source-follower circuits instead of emitter-follower circuits. The fifth embodiment of the present invention has the same advantages as the first embodiment of the present invention. It is also possible to design the second through fourth embodiments of the present invention so that they have source-follower circuits instead of emitter-follower circuits.

The present invention is not limited to the specifically disclosed embodiments, and variations and modifications may be made without departing from the scope of the present invention.

What is claimed is:

1. A semiconductor integrated circuit comprising:
a plurality of data buses;
emitter-follower circuits arranged in said data buses;
read means, coupled to said emitter-follower circuits, for reading data transmitted through said data buses through said emitter-follower circuits; and
test means, coupled to said data buses through said emitter-follower circuits, for determining whether said data transmitted through said data buses has an error and for transmitting an output test signal to at least one of said data buses during a test mode, said output test signal having a potential level higher than that of said data transmitted through said data buses during a normal mode and said output test signal having a logic low level which has a potential level higher than a logic high level of the data during the normal mode,
wherein said test means further comprises an emitter-follower output circuit, which transmits said output test signal to said one of said data buses.

2. The semiconductor integrated circuit as claimed in claim 1, wherein said emitter-follower output circuit of said test means is connected to said one of said data buses to transmit said output test signal to said read means.

3. The semiconductor integrated circuit as claimed in claim 1, further comprising output buffer means, coupled to said read means, for transmitting an output data signal based on said data read by said read means and said output test signal to an external circuit.

4. The semiconductor integrated circuit as claimed in claim 1, further comprising a memory cell array having a plurality of memory cells coupled to said data buses.

5. A semiconductor integrated circuit comprising:
a plurality of data buses;
emitter-follower circuits arranged in said data buses;
read means, coupled to said emitter-follower circuits, for reading data transmitted through said data buses through said emitter-follower circuits; and
test means, coupled to said data buses through said emitter-follower circuits, for determining whether said data transmitted through said data buses has an error and for transmitting an output test signal to at least one of said data buses during a test mode, said output test signal having a potential level higher than that of said data transmitted through said data buses during a normal mode, wherein:
each of said data buses comprises a first data bus line and a second data bus line;
said output test signal comprises a first signal component and a second signal component; and
said emitter-follower output circuit of said test means comprises:
a first transistor having a base receiving said first signal component, a collector receiving a power supply voltage, and an emitter connected to said first data bus line; and
a second transistor having a base receiving said second signal component, a collector receiving said power supply voltage, and an emitter connected to said second data bus line.

6. A semiconductor integrated circuit comprising:
a plurality of data buses;
emitter-follower circuits arranged in said data buses;
read means, coupled to said emitter-follower circuits, for reading data transmitted through said data buses through said emitter-follower circuits; and
test means, coupled to said data buses through said emitter-follower circuits, for determining whether said data transmitted through said data buses has an error and for transmitting an output test signal to at least one of said data buses during a test mode, said output test signal having a potential level higher than that of said data transmitted through said data buses during a normal mode, wherein:
each of said data buses comprises a first data bus line and a second data bus line; and
each of said emitter-follower circuits comprises a first input terminal, a first emitter terminal and a second emitter terminal, wherein:
said first input terminal receives said data from said first data bus line;
said first emitter terminal is connected to said read means; and
said second emitter terminal is connected to said test means.

7. The semiconductor integrated circuit as claimed in claim 6, wherein
each of said emitter-follower circuits further comprises a second input terminal, a third emitter terminal and a fourth emitter terminal wherein:
said second input terminal receives the data through said second data bus line;
said third emitter terminal is connected to said read means; and
said fourth emitter terminal is connected to said test means.

8. The semiconductor integrated circuit as claimed in claim 6, wherein each of said emitter-follower circuits comprises a bipolar transistor having a base forming said first input terminal, a collector receiving a power supply voltage, a first emitter forming said first emitter terminal, and a second emitter forming said second emitter terminal.

9. A semiconductor integrated circuit as claimed in claim 6, wherein
each of said emitter-follower circuits comprises first and second bipolar transistors wherein:
said first bipolar transistor has a base forming said first input terminal, a collector receiving a power supply voltage, and an emitter forming said first emitter terminal; and
said second bipolar transistor has a base connected to the base of the first bipolar transistor, a collector receiving the power supply voltage, and an emitter forming said second emitter terminal.

10. A semiconductor integrated circuit comprising:
a plurality of data buses;
emitter-follower circuits arranged in said data buses;
read means, coupled to said emitter-follower circuits, for reading data transmitted through said data buses through said emitter-follower circuits; and
test means, coupled to said data buses through said emitter-follower circuits, for determining whether said data transmitted through said data buses has an error and for transmitting an output test signal to at least one of said data buses during a test mode, said output test signal having a potential level higher than that of said data transmitted through said data buses during a normal mode, wherein said test means further comprises:
first-stage test circuit means for determining, for each of said data buses, whether or not said data has an error and for generating first-stage test output signals for each data bus;
test bus, connected to said first-stage circuit means, carrying said first-stage test output signals for each of said data buses; and
second-stage test circuit means for determining whether or not said data transmitted through said data buses has an error based on said first-stage test output signals and for generating the output test signal.

11. The semiconductor integrated circuit as claimed in claim 10, wherein said first-stage test circuit means further comprises a wired-OR circuit, which transmits said first-stage test output signals to said test bus.

12. The semiconductor integrated circuit as claimed in claim 11, wherein:
said test bus has a first test bus line and a second test bus line; and
said first-stage test circuit means further comprises:
means for setting said first test bus line and said second test bus line to a first potential level and a second potential level based upon said first-stage test output signals indicating that said data transmitted through said data buses is without error; and
means for setting both said first test bus line and said second test bus line to either said first potential level or said second potential level based upon said first-stage test output signals indicating that said data transmitted through said data buses has an error.

13. The semiconductor integrated circuit as claimed in claim 12, wherein:
said one of said data buses coupled to said test means comprises a first data bus line and a second data bus line; and
said second-stage test circuit means further comprises:
means for setting said first data bus line to a reference potential level; and
means for setting said second data bus line to a third potential level based on potential levels of said first and said second test bus lines.

14. The semiconductor integrated circuit as claimed in claim 13, wherein:
said third potential level of said second data bus line is higher than said reference potential level upon testing means determining that said data transmitted through said data buses is without error; and
said third potential level of said second data bus line is lower than said reference potential level upon testing means determining that said data transmitted through said data buses has error.

15. The semiconductor integrated circuit as claimed in claim 11, wherein said second-stage test circuit means further comprises an emitter-follower output circuit, which outputs the output test signal to said one of said data buses.

16. A semiconductor integrated circuit comprising:
a plurality of data buses;
emitter-follower circuits arranged in said data buses;

read means, coupled to said emitter-follower circuits, for reading data transmitted through said data buses through said emitter-follower circuits; and test means, coupled to said data buses through said emitter-follower circuits, for determining whether said data transmitted through said data buses has an error and for transmitting an output test signal to at least one of said data buses during a test mode, said output test signal having a potential level higher than that of said data transmitted through said data buses during a normal mode, wherein:

said read means comprises a plurality of read circuits;

said emitter-follower circuits are divided into a first emitter-follower group and a second emitter-follower group;

said data buses are divided into a first data bus group and a second data bus group; and one of said data buses in said first data bus group and one of said data buses in said second data bus group are coupled to each other through one of said emitter-follower circuits in said first emitter-follower group and one of said emitter-follower circuits in said second emitter-follower group, said one of said first data bus group and said one of said second data bus group are coupled to one of said read circuits and said test means.

17. The semiconductor integrated circuit as claimed in claim 16, wherein said data buses in said first data bus group and said data buses in said second data bus group are connected to said read circuits.

18. A semiconductor integrated circuit comprising:
a plurality of data buses;
emitter-follower circuits arranged in said data buses;
read means, coupled to said emitter-follower circuits, for reading data transmitted through said data buses through said emitter-follower circuits; and
test means, coupled to said data buses through said emitter-follower circuits, for determining whether said data transmitted through said data buses has an error and for transmitting an output test signal to at least one of said data buses during a test mode, said output test signal having a potential level higher than that of said data transmitted through said data buses during a normal mode, wherein said test means further comprises:
means for receiving expected-value data; and
means for outputting said test output signal to said one of said data buses upon determining that said data transmitted through said data buses is the same as said expected-value data.

19. A semiconductor integrated circuit comprising:
a plurality of data buses;
source follower circuits arranged in said data buses;
read means, coupled to said source follower circuits, for reading data transmitted through said data buses through said source follower circuits; and
test means, coupled to said data buses through said source follower circuits, for determining whether said data transmitted through said data buses has an error and for transmitting an output test signal to at least one of said data buses during a test mode, said output test signal having a potential level higher than that of said data transmitted through said data buses during a normal mode and said output test signal having a logic low level which has a potential level higher than the logic high level of the data during the normal mode,
wherein said test means further comprises a source follower output circuit, which transmits said output test signal to said one of said data buses.

20. The semiconductor integrated circuit as claimed in claim 19, wherein said source follower output circuit of said test means is connected to said one of said data buses to transmit said output test signal to said read means.

21. The semiconductor integrated circuit as claimed in claim 19, further comprising output buffer means, coupled to said read means, for transmitting an output data signal based on said data read by said read means and said output test signal to an external circuit.

22. The semiconductor integrated circuit as claimed in claim 19, further comprising a memory cell array having a plurality of memory cells coupled to said data buses.

23. A semiconductor integrated circuit comprising:
a plurality of data buses;
source follower circuits arranged in said data buses;
read means coupled to said source follower circuits, for reading data transmitted through said data buses through said source follower circuits; and
test means, coupled to said data buses through said source follower circuits, for determining whether said data transmitted through said data buses has an error and for transmitting an output test signal to at least one of said data buses during a test mode, said output test signal having a potential level higher than that of said data transmitted through said data buses during a normal mode, wherein said test means comprises a source follower output circuit, which transmits said output test signal to said one of said data buses, and wherein:
each of said data buses comprises a first data bus line and a second data bus line;
said output test signal comprises a first signal component and a second signal component; and
said source follower output circuit of said test means further comprises:
a first transistor having a gate receiving said first signal component, a drain receiving a power supply voltage, and a source connected to said first data bus line, and
a second transistor having a gate receiving said second signal component, a drain receiving said power supply voltage, and a source connected to said second data bus line.

24. A semiconductor integrated circuit comprising:
a plurality of data buses;
source follower circuits arranged in said data buses;
read means, coupled to said source follower circuits, for reading data transmitted through said data buses through said source follower circuits; and
test means, coupled to said data buses through said source follower circuits, for determining whether said data transmitted through said data buses has an error and for transmitting an output test signal to at least one of said data buses during a test mode, said output test signal having a potential level higher than that of said data transmitted through said data buses during a normal mode, wherein:
each of said data buses comprises a first data bus line and a second data bus line;
each of said source follower circuits comprises a first input terminal, a first source terminal, and a second source terminal, wherein:

said first input terminal receives the data from said first data bus line,
said first source terminal is connected to said read means; and
said second source terminal is connected to said test means.

25. The semiconductor integrated circuit as claimed in claim 24, wherein
each of said source follower circuits comprises first and second field effect transistors, wherein:
the first field effect transistor has a gate forming said first input terminal, a drain receiving a power supply voltage, and a source forming said first source terminal; and
the second field effect transistor has a gate connected to the gate of the first field effect transistor, a drain receiving the power supply voltage, and an source forming said second source terminal.

26. A semiconductor integrated circuit comprising:
a plurality of data buses;
source follower circuits arranged in said data buses;
read means, coupled to said source follower circuits, for reading data transmitted through said data buses through said source follower circuits; and
test means, coupled to said data buses through said source follower circuits, for determining whether said data transmitted through said data buses has an error and for transmitting an output test signal to at least one of said data buses during a test mode, said output test signal having a potential level higher than that of said data transmitted through said data buses during a normal mode, wherein said test: means further comprises:
first-stage test circuit means for determining, for each of said data buses, whether or not: said data has an error and for generating first-stage test output signals for each data bus;
a test bus, connected to said first-stage circuit means, carrying said first-stage test output signals for each of said data buses; and
second-stage test circuit means for determining whether or not said data transmitted through said data buses has an error based on said first-stage test output signals and for generating the output test signal.

27. The semiconductor integrated circuit as claimed in claim 26, wherein said first-stage test circuit means further comprises a wired-OR circuit, which transmits said first-stage test output signals to said test bus.

28. The semiconductor integrated circuit as claimed in claim 26, wherein:
said test bus has a first test bus line and a second test bus line; and
said first-stage test circuit means further comprises:
means for setting said first test bus line and said second test bus line to a first potential level and a second potential level based upon said first-stage test output signals indicating that said data transmitted through said data buses is without error; and
means for setting both said first test bus line and said second test bus line to either said first potential level or said second potential level based upon said first-stage test output signals indicating that said data transmitted through said data buses has an error.

29. The semiconductor integrated circuit as claimed in claim 28, wherein:
said one of said data buses coupled to said test means comprises a first data bus line and a second data bus line;
said second-stage test circuit means further comprises:
means for setting said first data bus line to a reference potential level; and
means for setting said second data bus line to a third potential level based on said potentials of said first and second test bus lines.

30. The semiconductor integrated circuit as claimed in claim 29, wherein:
said third potential level of said second data bus line is higher than said reference potential level upon testing means determining that said data transmitted through said data buses is without error; and
said third potential level of said second data bus line is lower than said reference potential level upon testing means determining that said data transmitted through said data buses has an error.

31. The semiconductor integrated circuit as claimed in claim 27, wherein said second-stage test circuit means further comprises a source follower output circuit, which outputs said output test signal to said one of said data buses.

32. A semiconductor integrated circuit comprising:
a plurality of data buses;
source follower circuits arranged in said data buses;
read means, coupled to said source follower circuits, for reading data transmitted through said data buses through said source follower circuits; and
test means, coupled to said data buses through said source follower circuits, for determining whether said data transmitted through said data buses has an error and for transmitting an output test signal to at least one of said data buses during a test mode, said output test signal having a potential level higher than that of said data transmitted through said data buses during a normal mode, wherein:
said read means comprises a plurality of read circuits;
said source follower circuits are divided into a first source follower group and a second source follower group;
said data buses are divided into a first data bus group and a second data bus group; and
one of said data buses in said first data bus group and one of said data buses in said second data bus group are coupled to each other through one of said source follower circuits in said first data bus group and one of said source follower circuits in said second data bus group, said one of said first data bus group and said one of said second data bus group are coupled to one of said read circuits and said test means.

33. The semiconductor integrated circuit as claimed in claim 32, wherein said data buses in said first data bus group and said data buses in said second data bus group are connected to said read circuits.

34. A semiconductor integrated circuit comprising:
a plurality of data buses;
source follower circuits arranged in said data buses;
read means, coupled to said source follower circuits, for reading data transmitted through said data buses through said source follower circuits; and test means, coupled to said data buses through said source follower circuits, for determining whether said data transmitted through said data buses has an error and for transmitting an output test signal to at least one of said data buses during a test mode, said output test signal having a potential level higher than that of said data transmitted through said data buses during a normal mode, wherein said test means further comprises:

means for receiving expected-value data; and means for outputting said test output signal to said one of said data buses upon determining that said data transmitted through said data buses is same as said expected-value data.

* * * * *

UNITED STATES PATENT AND TRADEMARK OFFICE
CERTIFICATE OF CORRECTION

PATENT NO. : 5,418,791

DATED : May 23, 1995

INVENTOR(S) : Okajima

It is certified that error appears in the above-indentified patent and that said Letters Patent is hereby corrected as shown below:

Title Page [30], change "Dec. 20, 1990" to --Dec. 22, 1990--.

Col. 3, line 61, change "X$\overline{T}$," to --$\overline{T}$,--;

line 62, change "transfers" to --transmits--;

line 64, change "X$\overline{Q}$" to --$\overline{Q}$--.

Col. 4, lines 1, 4, 11, 13, 18, 23 and 27, change "X$\overline{D}$" to --$\overline{D}$--;

lines 2, 3, 6, 7, 10, 19, 21, 22, 24 and 29, change "X$\overline{T}$" to --$\overline{T}$--.

Col. 5, lines 2, 5, 9 and 17, change "X$\overline{T}$" to --$\overline{T}$--;

lines 6 and 9, change "X$\overline{D}$" to --$\overline{D}$--;

lines 7, 18 and 62, change "X$\overline{Q}$" to --$\overline{Q}$--;

line 14, change "X$\overline{Q}$=/T-V$_{BE}$" to --$\overline{Q}$=$\overline{T}$-V$_{BE}$--.

Col. 6, lines 4, 14 and 33, change "X$\overline{D}$" to --$\overline{D}$--;

lines 64 and 66, change "X$\overline{Q}$" to --$\overline{Q}$--.

UNITED STATES PATENT AND TRADEMARK OFFICE
CERTIFICATE OF CORRECTION

PATENT NO. : 5,418,791
DATED : May 23, 1995
INVENTOR(S) : Okajima

It is certified that error appears in the above-indentified patent and that said Letters Patent is hereby corrected as shown below:

Col. 7,  lines 3, 15 and 19, change "$X\overline{Q}$" to --$\overline{Q}$--.
Col. 8,  lines 20, 25, 28 and 32, change "$X\overline{D}$" to --$\overline{D}$--;
         lines 36, 40, 57 and 58, change "$X\overline{Q}$" to --$\overline{Q}$--.
Col. 9,  line 9, change "no" to --not--.
Col. 15, line 34, change "test:" to --test--;
         line 37, change "not:" to --not--.

Signed and Sealed this

Seventeenth Day of October, 1995

Attest:

BRUCE LEHMAN

*Attesting Officer*    *Commissioner of Patents and Trademarks*